United States Patent [19]

Baney et al.

[11] Patent Number: 4,994,420
[45] Date of Patent: Feb. 19, 1991

[54] METHOD FOR FORMING CERAMIC MATERIALS, INCLUDING SUPERCONDUCTORS

[75] Inventors: Ronald H. Baney; Debora F. Bergstrom, both of Midland; Bruce H. Justice, Dearborn, all of Mich.

[73] Assignee: Dow Corning Corporation, Midland, Mich.

[21] Appl. No.: 420,172

[22] Filed: Oct. 12, 1989

[51] Int. Cl.$^5$ .............................. H01B 12/00
[52] U.S. Cl. ...................... 501/126; 505/725; 505/737; 423/593; 423/604; 423/636
[58] Field of Search ............ 505/896, 725, 734, 735, 505/736, 737, 738, 742; 423/593, 604, 635, 636

[56] References Cited

U.S. PATENT DOCUMENTS

| | | | |
|---|---|---|---|
| 2,612,442 | 9/1952 | Goetzel | 75/22 |
| 2,746,888 | 5/1956 | Ross | 117/221 |
| 2,935,411 | 5/1960 | Robinson | 106/39 |
| 3,010,850 | 11/1961 | Colbert et al. | 117/211 |
| 3,015,590 | 1/1962 | Fuller | 148/1.5 |
| 3,437,515 | 4/1969 | Quinn et al. | 117/100 |
| 3,443,989 | 5/1969 | Wilhelm | 117/227 |
| 3,475,124 | 10/1969 | Darr et al. | 23/202 |

FOREIGN PATENT DOCUMENTS

| | | | |
|---|---|---|---|
| 0279527 | 11/1988 | Japan | 505/737 |
| 63-281321 | 11/1988 | Japan | 505/737 |
| 0299018 | 12/1988 | Japan | 505/737 |
| 64-12416 | 1/1989 | Japan | 505/737 |

OTHER PUBLICATIONS

"Synthesis of Barium Titanate at Low Temperature", by Datta et al., Jul., 1987.

"Formation of Thin-Film High $T_c$ Superconductors by Metalorganic Deposition", Appl. Phys. Lett. 51(25), Dec. 21, 1987.

Appl. Phys. Lett., vol. 54 (24) "Preparation of Y-Ba-Cu-O Super-Conducting Thin Films Using $BaF_2$ as a Buffer Layer", Radpour et al., Jun., 1989, p. 2479.

App. Phys. Lett 53(17) Oct. 24, 1988, "Passivation of High $T_c$ Superconductor Surfaces with $CaF_2$ and Bi, Al, and Si Oxides", Hill et al., p. 1657-1659.

"Oxygen Deficiency and Superconducting Properties of Yttrium Oxide Cpds", Nakamura et al., Apr., 1987 (presented at MRS Conference).

"A Hydroxycarbonate Rate to Superconductor Precursor Powders", Voigt et al., Mat. Res. Soc. Symp., vol. 99 (1988), p. 635-638.

"Chemical Vapor Deposition of $YBa_2Cu_3O_7$ Using Metal Organic Chelate Precursors", Panson et al., Appl. Phys. Letters, 8/1988.

"Chemical Vapor Deposition of the Superconducting $YBa_2Cu_3O_{7-x}$ Phase Using Halides as Metal Sources", Ottoson et al., App. Phys. Lett (54)24, June 12, 1989, p. 2476.

Primary Examiner—William R. Dixon, Jr.
Assistant Examiner—Paul Marcantoni
Attorney, Agent, or Firm—Price, Heneveld, Cooper, DeWitt & Litton

[57] ABSTRACT

The specification discloses forming ceramic films, and especially high temperature superconductor films, by dissolving ceramic precursor metal iodides in organic solvents, applying them to a substrate, evaporating the solvent and pyrolyzing and annealing the resulting ceramic precursor metal iodide films.

34 Claims, No Drawings

METHOD FOR FORMING CERAMIC MATERIALS, INCLUDING SUPERCONDUCTORS

BACKGROUND OF THE INVENTION

The present invention relates to the production of metal oxides, such as ceramic materials and high temperature superconductors. The preparation of ceramic materials typically involves grinding mixtures of ceramic oxides often including silicon dioxide and sintering the resulting mixture at high temperatures, e.g., 900° to 1200° C.

High temperature superconductors are prepared in a similar manner, without silicon dioxide. Superconductors do present a more complicated problem than other ceramic materials in that one must not only obtain an integrated mass as in the case of a ceramic object, but also a mass which is superconductive at temperatures above 23K, preferably above 77K, the temperature of inexpensive liquid nitrogen. There is less predictability in whether or not a given method of preparation will yield such a superconductor than there is in predicting whether or not one will obtain an integral mass.

It is well-known that the orthorhombic phase of perovskite structure for $Ln_{1.0}Ba_{2.0}Cu_{3.0}O_{(7-x)}$ (sometimes referred to as "1-2-3") is a high $T_c$ superconductor material. Ln is preferably yttrium (Y), but can also be lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). It is also well-known that the orthorhombic phase can be easily obtained from the tetragonal phase, by oxidation in oxygen and by annealing at about 500° C. Early routes to this material involved grinding the oxide or carbonate phase of yttrium, barium and copper, then sintering and ultimately- annealing in oxygen.

It was recognized that useful applications for this material would require thin film geometries not easily obtained by the above mentioned processes. Therefore, numerous processes were developed for processing this ceramic material into more useful shapes such as films and fibers. Thin film geometries are especially difficult.

Several high energy vapor routes were developed for formation of films. These processes, though useful, do not lend themselves to simple coating processing such as dip coating, flow coating or spin coating It was therefore desirable to develop solution coating procedures. One was developed by dissolving nitrate salts of yttrium, barium and copper in hot water. Upon cooling, the material separated into phases, so the process must be carried out under the difficult conditions of hot solvents. The so-called metallorganic or sol/gel processes were also developed. The sol/gel precursors fall into three classes: metal salts of fatty acid esters, metal alkoxide or metal β-diketone complexes dissolved in organic solvents. These frequently suffer from low solubility so that concentrated solution of the mixed salts is difficult to obtain. Thus, aging or refluxing was sometimes required.

SUMMARY OF THE INVENTION

In the present invention, we produce ceramic materials, including superconductors, from organic solutions of ceramic precursor metal iodides. Ceramic precursor metal iodides are unexpectedly unique in that only they, of all the halide derivatives, are capable of producing high yields of ceramic, and especially superconductive, materials. It is believed that this is because the ceramic precursor metal iodides are uniquely soluble in organic solvents and are readily oxidized in an oxygen environment to the corresponding oxides.

Because iodide is a monovalent anion, metal oxide films formed from these iodide precursors sinter better, yielding a more dense film The iodides also tend to convert to oxides at lower temperatures than is the case for other ceramic precursors This results in the possibility of creating ceramic materials at lower temperatures.

Also surprising is the fact that in using iodides in accordance with the present invention to apply a ceramic or superconductive film on a single crystal template substrate, as for example strongium titanate, we obtain oriented films.

These and other objects, advantages and features of the invention will be more fully understood and appreciated by reference to the written specification.

DESCRIPTION OF THE PREFERRED EMBODIMENT

In the preferred embodiment, a ceramic precursor metal iodide is dissolved in a suitable organic solvent. The resulting solution may be blended with solutions of other ceramic precursor metal iodides or other ceramic precursor metal compounds. The solution is applied to a substrate on which a film is desired and the solvent is evaporated. The resulting layer is pyrolyzed to convert the iodide to an oxide.

The term "ceramic precursor metal" and the term "ceramic" as used herein are intended to be broad inclusive terms. Generally, the metals whose iodides appear to be operable in the present invention include the elements of periodic groups IIA, IIIA, IVA except carbon IIIB, IVB, VB, VIB, VIIB, antimony, bismuth, iron, cobalt, nickel, iridium, copper, silver, and the lanthanides. While not all of these elements are strictly thought of as metals, the term "metal" or the term "ceramic precursor metal" as used herein is intended to encompass them.

The term "iodide" as used herein is intended to reference a metal salt having at least one iodide anion. The salt could include ligands other than iodides. Further, the terms "metal iodide" or "metal iodide film" are not intended to rule out the possible inclusion of some impurities in such films.

Of special interest to the present invention are the iodides of yttrium, barium and copper. These can be used to generate the so-called high temperature cuprate superconductors, of which the most common is the so-called "1-2-3" cuprate, comprising $Y_1Ba_2Cu_3O_{7-d}$, where d is not greater than .5. Of course, it will be appreciated by those skilled in the art that some variation from a precise 1:2:3 molar ratio may be acceptable or in some circumstances necessary to achieve superconductivity. It is of course known that yttrium can be replaced by lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). Given the comparability in the chemistry of the various lanthanide metal compounds, the invention is believed broadly applicable to all of the ceramic precursor metal iodides.

It is believed that the present invention would also be useful in producing other cuprate high temperature superconducting systems For example, the bismuth cuprate high temperature superconducting system comprises:

$Bi_aCa_bSr_cCu_dO_x$, where superconductivity has been achieved at various a:b:c:d:x ratios. Yet another cuprate superconductive system is the thallium system, as follows:

$Tl_aCa_bBa_cCu_dO_x$, where superconductivity has been achieved at various a:b:c:d:x ratios The temperatures at which these materials must be heated to achieve superconductivity tend to be a little more critical than they are in the case of the 1-2-3 system described above. The bismuth systems are typically pyrolyzed in the range of 850° C. and the thallium systems are typically pyrolyzed between 800° and 880° C.

The organic solvent must be one in which the ceramic precursor metal iodides are soluble. It should also evaporate readily so that a film of ceramic precursor metal iodide can readily be formed on a substrate. Typically, mixed solvent systems are needed to cosolubilize more than one ceramic precursor metal iodide or a ceramic precursor metal iodide and another oxide precursor. Different ceramic precursor metal iodides solubilize differently in different solvents.

Representative solvents include methoxyethanol, ethoxyethanol, methylcellosolve, ethylcellosolve and acetonitrile. Ethanol is effective as a cosolvent, and will dissolve some of the ceramic precursor metal iodides alone. A good solvent mix includes acetonitrile, methoxyethanol and ethanol. Ethanol alone will dissolve some of the ceramic precursor metal iodides, but not others.

For purposes of forming films, it is desirable to maximize the concentration of the ceramic precursor metal iodide in solution. This helps to insure the formation of suitably dense films free of undesirable voids. In the formation of superconductors, the Ln, Ba and Cu iodides are dissolved in the 1:2:3 molar ratio which is characteristic of these superconductors.

It will also be desirable in some instances to enhance the solubility of one ceramic precursor metal iodide by coadding a more soluble ceramic precursor metal iodide. For example, the solubility of copper iodide (CuI) in methoxyethanol can be substantially enhanced by simultaneously adding barium iodide ($BaI_2 \cdot 2H_2O$). This is apparently due to the formation of $CuI_2-$.

In some instances, solubility may also be enhanced by using a mixed ligand system. The salt might comprise an iodide ligand and another ligand associated with a common metal, e.g., $Me_1IL$. Alternatively, the two different ligands might be associated with separate ions of the same metal, e.g., and $Me_1I_2$ and $Me_1L_2$. Finally, different metals may be associated with the different ligands, e.g., $Me_1I_2$ and $Me_2L_2$. A combination of the iodide and other ligand may in some instances increase the solubility of both the metal iodide and metal other ligand.

A mixed system may also be desirable where one wishes to enhance the film obtained by using ceramic precursors other than metal iodides. By combining a metal iodide with such other ceramic precursor, one may create a film which, as a whole, will sinter better than will the noniodide ceramic precursor alone.

A solution of one or more ceramic precursor metal iodides is then applied to a suitable substrate by dip coating, spin coating, flow coating or the like. The solvent is allowed to evaporate and the resulting coating is pyrolyzed. Preferably, repeated coatings of the iodide solutions are applied. Each layer is preferably dried in an oven under oxygen flow at approximately 180° to 210° C. for five minutes following coating. One can apply anywhere from a few to ten, twenty, or more layers, depending on how thick one wants the final coating to be. After the multiple layers are applied and dried, the coating is subjected to pyrolysis in oxygen.

By applying the coatings to a template crystal substrate, one can, through the use of tho present invention, obtain an oriented film. Thus, a 1-2-3 superconductive film of (100) orientation was obtained by applying metal iodide solutions to strontium titanate crystals and subjecting the resulting film to pyrolysis in oxygen. Other crystals which may serve a similar "template" function include magnesia crystals.

The specific temperature and time of pyrolysis will vary with the different ceramic precursor metal iodides. The heating should be done in an oxygen containing environment. The oxygen converts the metal iodide to the desired oxide. In addition, carbon dioxide should be specifically avoided in the case of some of the metals, as for example the group IIA metals, in order to prevent their conversion to carbonates. Copper iodide has been found to pyrolyze to copper oxide at temperatures of 600° C., maintained for six hours, annealed at 450° C. for 15 hours. On the other hand, barium iodide appears to form $Ba_5(IO_6)_2$ at 600° C. Pyrolyzing at 950° C. for one hour and then annealing at 450° C. for another 11 hours does convert barium iodide substantially to barium oxide.

It is preferable that the pyrolysis be accompanied by an oxygen annealing procedure, e.g., following the initial higher temperature pyrolysis with maintenance of the oxide at a lower but still elevated temperature for a period of time. As with any ceramic material, this helps prevent stress cracking, and in forming superconductors is required to cause conversion from the tetragonal to the superconducting orthorhombic phase. As noted above, barium iodide has been pyrolyzed at 950° C. for one hour, and then annealed by maintaining the sample at 450° C. for 11 hours.

EXAMPLES

Example 1:

The following were dissolved in 100 cc of denatured ethanol and 300 cc methoxyethanol:

| Barium iodide [$BaI_2 \cdot 2H_2O$] | 1.70 grams | 4 mM |
|---|---|---|
| Yttrium isopropoxide [$Y(OPr)_3$] | .532 grams | 2 mM |
| Copper acetylacetonate [$Cu(Acac)_2$] | 1.57 grams | 6 mM |

After dissolution, 10 mM of concentrated hydrochloric acid was added to keep the copper in its II valence state.

The solvent was then evaporated and the resulting solids heated to 950° C. in an oxygen containing environment, essentially free of carbon dioxide, at a rate of approximately 50° C. per 15 minutes. The temperature was maintained at 950° C. for two hours. The solids were then cooled to 450° C. and held at that temperature in oxygen, free of carbon dioxide, for another 72 hours. X-ray defraction of the resulting yttrium barium copper oxide ($Y_1Ba_2Cu_3O_{(7-d)}$) demonstrated the presence of the orthorhombic phase, characteristic of the high temperature superconductor, as well as the tetragonal phase.

Example 2:

For purposes of comparison, an attempt was made to utilize a ceramic precursor metal chloride, rather than a ceramic precursor metal iodide. The following ingredients, along with .187 grams of water, were dissolved in 400 mM of ethoxyethanol:

| | |
|---|---|
| Yttrium isopropoxide [Y(OPr)$_3$] | .426 grams |
| Barium [forming Ba(OC$_2$H$_4$OC$_2$H$_4$)$_2$] | .439 grams |
| Copper chloride [CuCl$_2$] | .645 grams |

This material phase separated before evaporation was completed. It would not be operable in forming the cuprate superconductor.

Example 3:

The experiment of example 2 was repeated except that methoxyethanol was used in place of ethoxyethanol. In addition, 0.15 mM of diethylamine was added to try to prevent phase separation. Phase separation was not successfully prevented. An attempt to fire the resulting mass at 950. C for 16 hours in an oxygen and water atmosphere, less carbon dioxide, followed by annealing at 450° C. indicated that the barium chloride had not been oxidized.

Example 4:

A series of runs was conducted using the ingredients and solvents indicated below in Tables 1 and 2, respectively, comparing different ceramic precursor metal iodides to other ceramic precursor metal halides, usually in combination with other oxide precursors, in an attempt to form high temperature superconductors. Table 3 comprises comments on the solutions and evaporants by run number. The evaporants were then fired and annealed in accordance with the following temperature and time schedule:

| Temperature | Time |
|---|---|
| 25 to 400° C. | 2 hour ramp |
| 400 to 550° C. | 30 minute ramp |
| 550° C. | 1 hour soak |
| 850 to 950° C. | 10 minute ramp |
| 950° C. | 1 hour soak |
| 950 to 450° C. | ramp as fast as possible |
| 450° C. | 11 hour soak |
| 450 to 25° C. | oven cool |

The resulting products were subjected to S-ray diffraction to determine whether they showed the orthorhombic structure characterized by high temperature superconductors with the results being indicated in Table 4.

TABLE 1

| | Transition Metal Oxide Precursors Used | | |
|---|---|---|---|
| Run No. | 2 mmol Wt Ba Cpd. g | 1 mmol Wt Y Cpd. g | 3 mmol Wt Cu Cpd. g |
| 1 | 0.489 BaCl$_2$.H$_2$O | 0.266 Y(OPr)$_3$ | 0.785 Cu(Acac)$_2$ |
| 2 | 0.666 BaBr$_2$.H$_2$O | 0.266 Y(OPr)$_3$ | 0.785 Cu(Acac)$_2$ |
| 3 | 0.275 Ba | 0.266 Y(OPr)$_3$ | 0.670 CuBr$_3$ |
| 4 | 0.275 Ba | 0.195 YCl$_3$ | 0.788 Cu(Acac)$_2$ |
| 5 | 0.854 BaI$_2$.2H$_2$O | 0.266 Y(OPr)$_3$ | 0.785 Cu(Acac)$_2$ |
| 6 | 0.854 BaI$_2$.2H$_2$O | 0.266 Y(OPr)$_3$ | 0.785 Cu(Acac)$_2$ |
| 7 | 0.854 BaI$_2$.2H$_2$O | 0.266 Y(OPr)$_3$ | 0.785 Cu(Acac)$_2$ |
| 8 | 0.275 Ba | 0.266 Y(OPr)$_3$ | 0.403 CuCl$_2$ |
| 9 | 0.351 BaF$_2$ | 0.266 Y(OPr)$_3$ | 0.785 Cu(Acac)$_2$ |
| 10 | 0.275 Ba | 0.266 Y(OPr)$_3$ | 0.785 Cu(Acac)$_2$ |
| 11 | 0.854 BaI$_2$.2H$_2$O | 0.266 Y(OPr)$_3$ | 0.785 Cu(Acac)$_2$ |
| 12 | 0.275 Ba | 0.543 DyI$_3$ | 0.785 Cu(Acac)$_2$ |

TABLE 2

| | Amount Of Water And Solvents Used | |
|---|---|---|
| Run No. | Ml H$_2$O | Ml Solvent |
| 1 | 45 | 155 3:1 Methyl Cellosolve/EtOH |
| 2 | 45 | 155 3:1 Methyl Cellosolve/EtOH |
| 3 | 120 | 80 3:1 Methyl Cellosolve/EtOH |
| 4 | 120 | 80 3:1 Methyl Cellosolve/EtOH |
| 5 | 45 | 155 3:1 Methyl Cellosolve/EtOH |
| 6 | 45 | 155 Methyl Cellosolve |
| 7 | 45 | 155 EtOH |
| 8 | 120 | 80 3:1 Methyl Cellosolve/EtOH |
| 9 | 120 | 80 3:1 Methyl Cellosolve/EtOH |
| 10 | 120 | 80 3:1 Methyl Cellosolve/EtOH |
| 11 | 45 | 155 Ethyl Cellosolve |
| 12 | 120 | 80 3:1 Methyl Cellosolve/EtOH |

TABLE 3

| Run No. | Comments Re Solutions And Evaporants |
|---|---|
| 1 | Dark blue solution required 50°0 C. to dissolve all Cu(Acac)$_2$; solid evaporant blue and white. |
| 2 | 50° C. necessary to dissolve all Cu(Acac)$_2$ to blue solution; evaporant blue and green solid. |
| 3 | Greenish-blue solution with gel character; solid single-phase green. |
| 4 | Dark blue solution at 50° C.; evaporant blue and green solid. |
| 5 | Dark blue solution at 50° C.; some blue solid at 10 cc; brown tarry mass at dryness |
| 6 | Blue solution, blue and brown solid at 10 cc; brown powdered solid at dryness |
| 7 | Not soluble, slurry at 10 cc; brown solid at dryness. |
| 8 | Light blue-green solution, green and white solids at 10 cc; blue-green solid at dryness. |
| 9 | White solid, BaF$_2$ and Cu(Acac)$_2$ appear in solution, blue and white solids at 10 cc; brown at dryness |
| 10 | Blue solution at 40° C., green solution at 10 cc; blue-black solid (nominal). |
| 11 | Cu(Acac)$_2$ didn't fully dissolve at 40° C., blue precipitate; brown powder. |
| 12 | Blue solution at 40° C., green at 10 cc; blue-black solid. |

TABLE 4

| | X-Ray Diffractions Results |
|---|---|
| Run No. | Orthorhombic 1-2-3 Obtained |
| 1 | No |
| 2 | No |
| 3 | No |
| 4 | No |
| 5 | Yes |
| 6 | Yes |
| 7 | Yes |
| 8 | No |
| 9 | No |
| 10 | Yes |
| 11 | Yes |
| 12 | Yes |

It will be noted that in runs 1–4, 8 and 9, we were not successful in obtaining the Ln$_1$, Ba$_2$, Cu$_3$, O$_{(7-d)}$ superconductor structure In run 1, we attempted to use barium chloride. In run 2, we attempted to use barium bromide. In run 3 we attempted to us copper bromide.

In run 4 we attempted to use yttrium chloride. In run 8 we attempted to use copper chloride and in run 9 we attempted to use barium fluoride. On the other hand, in all of the other runs, we did obtain the high temperature superconductor. In these cases, we were working with iodides and did not include any of the other ceramic precursor metal halides.

Example 5:

To demonstrate the preparation of solution precursor to the $Y_1Ba_2Cu_3O_{(7-d)}$ orthorhombic superconducting phase which contains all iodides, $YI_3$, $BaI_2 \cdot 2H_2O$, and $CuI$ in a 1:2:3 ratio, the following solution was prepared in an inert atmosphere glove box: into 50 ml of dry $CH_3CN$ (acetonitrile) were dissolved 0.29 g of CuI. Into this solution was dissolved 0.43 g of $BaI_2 \cdot 2H_2O$. Finally, 0.24 g of $YI_3$ was added to the solution. To get the $YI_3$ to dissolve, it was necessary to add to the solution 5 ml of dry ethanol, 10 ml more of acetonitrile and 6 ml dry methoxyethanol (ethylene glycol monomothylether).

To demonstrate the ability to convert the all-iodide precursor solution to the orthorhombic $Y_1Ba_2Cu_3O_{(7-d)}$ superconducting phase by pyrolysis of the precursor solution in bulk and film form, a 16 g aliquot of the all=iodide precursor solution, prepared as described above, was concentrated by removing the solvents under vacuum. This resulted in a viscous orange-brown oil. This viscous oil was used to spin coat a film on a silicon wafer (Si III TYGH Company, lot ##5727 wafer) at 3010 rpm spin speed using a six second spin time. The remainder of the oil was placed on a gold foil and pyrolyzed along with the film sample. The coated wafer was pyrolyzed under oxygen flow by heating to 815° C. at 4.3° C./minute and holding for one hour, then increasing to 915° C. at 1.7° C./minute and holding for one hour, cooling to 450° C. and holding for fourteen hours and finally slow cooling to room temperature. X-ray diffraction results indicated that both the film and bulk samples formed the orthorhombic $Y_1Ba_2Cu_3O_{(7-d)}$ superconducting phase. The film was not as desirable as hoped for and cracked due to the high concentration of the oil and the thickness of the resulting film.

Example 6:

A second attempt at film formation was made using a less concentrated sample of the all-iodide precursor solution. Another 16 ml aliquot of the all-iodide precursor solution was concentrated under vacuum again to an orange-brown oil. The oil was diluted to an approximately 15% solids solution by adding 1.0 ml of dry methoxyethanol. This solution was used to spin coat a silicon wafer (Si III TYGH Company, lot ##5773 wafer) at 3030 rpm spin speed using an eight second spin time. The wafer was pyrolyzed under oxygen by ramping from 30° C. to 850° C. at a heating rate of 5.1° C./minute, holding at 850° C. for one hour, ramping to 930° C. at 1.3° C./minute, holding for one hour, slow cooling to 450. C and holding for twelve hours and finally slow cooling to room temperature The photomicrographs of the film showed that it was of better quality than the film of Example 5, but the film was too thin to allow detection of the orthorhombic or the tetragonal superconducing phase using available X-ray diffraction techniques. There were possible traces of $BaSiO_4$ (barium silicate). It was concluded that a much thicker film was needed on a less reactive substrate in order to form and detect the orthorhombic superconducting phase.

Example 7:

This example demonstrates the formation of an orthorhombic $Y_1Ba_2Cu_3O_{(7-d)}$ film on the polished, single crystal $SrTiO_3$ (strontium titanate) substrate with (100) orientation.

The 15% solids solution of the all-iodides precursor described above in Example 6 was used to spin coat a film on a strontium titanate wafer substrate (Commercial Crystal Laboratories, Inc., P.O. #122329 using a 2000-2080 rpm spin speed and an 18-20 second spin time. The coating thickness was increased by application of several layers of the precursor solution Each layer was dried/fixed in an oven under oxygen flow at 180°-210° C. for five minutes following the spin coating application of the layer. It was found that high layer drying/fixing temperatures (625° C.) were too thermally shocking and caused the wafer substrate to fracture upon cooling. A total of twelve layers was applied. The coated wafer was then pyrolyzed under oxygen by ramping from 30 to 830° C. at 4.0° C./minute, holding for one hour at 830° C., ramping to 930° C. at 1.7° C./minute, holding at 930° C. for one hour, slow cooling to 450° C., holding at 450. C for twelve hours and finally slow cooling to room temperature Photomicrographs show a mottled but fairly continuous film both before and after pyrolysis. X-ray diffraction analysis indicates that the film is the orthorhombic superconducting phase which also shows a preferred orientation dominated by the (100) orientation. Preferred orientation films are highly desirable in thin film superconductors due to higher potential current carrying capabilities.

Conclusion

The foregoing experimental data illustrates that ceramic oxides, and especially high temperature superconductors can be obtained from organic solutions of ceramic precursor metal iodides, but not from the other ceramic precursor metal halides. The solutions are applied to a substrate, the organic solvent evaporated, and the resulting iodide layer pyrolyzed and preferably annealed to form the desired ceramic material. Of course, it is understood that the foregoing is merely a preferred embodiment of the invention and that various changes and alterations can be made without departing from the spirit and broader aspects thereof as set forth in the appended claims. These claims are to be interpreted in accordance with the principles of patent law, including the doctrine of equivalents.

The embodiments of the invention in which an exclusive property or privilege is claimed are defined as follows.

1. A method for forming metal oxides for use as ceramic materials or the like comprising:
　forming a solution comprising an organic solvent and at least one metal iodide;
　evaporating the organic solvent to leave a residue containing metal iodide;
　pyrolyzing said metal iodide in an oxygen containing atmosphere to convert it to a metal oxide.

2. The method of claim 1 which additionally includes annealing said metal oxide.

3. The method of claim 2 in which a plurality of different metal iodides are dissolved in an organic solvent.

4. The method of claim 3 in which a plurality of organic solvents are used to facilitate dissolution of said different metal iodides.

5. The method of claim 1 in which a plurality of different metal iodides are dissolved in an organic solvent.

6. The method of claim 5 in which a plurality of organic solvents are used to facilitate dissolution of said different metal iodides.

7. The method of claim 1 in which said solution of an organic solvent and at least one metal iodide is applied as a film over a substrate.

8. The method of claim 7 in which said film is applied to a template crystal substrate to yield, when pyrolyzed in oxygen, an oriented film.

9. The method of claim 8 which additionally includes annealing said metal oxide.

10. The method of claim 7 in which soluble ceramic precursors in addition to said metal iodides are added to said solution.

11. The method of claim 1 in which soluble ceramic precursors in addition to said metal iodides are added to said solution.

12. A method for forming high temperature cuprate superconductors comprising:

forming a solution by dissolving compatible, pyrolyzable metal compounds of a superconducting complex in at least one organic solvent in a molar ratio in accordance with the molar ratio of said metals in said superconductive complex, at least one of said pyrolyzable compounds being an iodide salt of one of said metals;

evaporating said solvent to form a residue of said pyrolyzable compounds;

said residue in an oxygen containing environment to convert said pyrolyzable metal compounds to metal oxides.

13. The method of claim 12 which additionally includes annealing said metal oxides.

14. The method of claim 13 wherein all of said pyrolyzable compounds comprise iodides of said metals.

15. The method of claim 14 in which a plurality of organic solvents are used to facilitate dissolution of said metal iodides.

16. The method of claim 12 wherein all of said pyrolyzable compounds comprise iodides.

17. The method of claim 16 in which a plurality of organic solvents are used to facilitate dissolution of said metal iodides.

18. The method of claim 12 in which a plurality of organic solvents are used to facilitate dissolution of said pyrolyzable metal compounds.

19. The method of claim 12 in which said solution is applied as a film over a substrate.

20. The method of claim 19 in which said film is applied to a template crystal substrate to yield, when pyrolyzed in oxygen, an oriented film.

21. The method of claim 20 which additionally includes annealing the metal oxide film.

22. The method of claim 20 in which said solution is applied by one of dip coating, spin coating, spray coating or flow coating.

23. A method for forming high temperature superconductors of the general formula $Ln_1Ba_2Cu_3O_{(7-d)}$, Ln (7-d), where Ln is selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), and d is less than .5, said method comprising: forming a solution by dissolving compatible, pyrolyzable compounds of Ln, Ba and Cu in at least one organic solvent in a molar ratio of approximately 1:2:3, at least one of said pyrolyzable compounds being an iodide salt of one of said metals;

evaporating said solvent to form a residue of said pyrolyzable compounds;

pyrolyzing said residue in an oxygen containing environment to convert them to oxides.

24. The method of claim 23 which additionally includes annealing the metal oxide film.

25. The method of claim 24 in which said solution is applied as a film over a substrate.

26. The method of claim 25 in which said film is applied to a template crystal substrate to yield, when pyrolyzed in oxygen, an oriented film.

27. The method of claim 25 in which soluble ceramic precursors in addition to said metal iodides are added to said solution.

28. The method of claim 23 in which said solution is applied as a film over a substrate.

29. The method of claim 28 in which said film is applied to a template crystal substrate to yield, when pyrolyzed in oxygen, an oriented film.

30. The method of claim 23 wherein all of said pyrolyzable compounds comprise iodides.

31. The method of claim 30 in which a plurality of organic solvents are used to facilitate dissolution of said metal iodides.

32. The method of claim 23 wherein all of said pyrolyzable compounds comprise iodides.

33. The method of claim 32 which additionally includes annealing the metal oxide film.

34. The method of claim 23 in which said oxygen containing environment is kept free of carbon dioxide.

* * * * *